United States Patent [19]
Tutt et al.

[11] Patent Number: 5,672,458
[45] Date of Patent: Sep. 30, 1997

[54] LASER DYE OR PIGMENT REMOVAL IMAGING PROCESS

[75] Inventors: Lee William Tutt; Mitchell Stewart Burberry, both of Webster; Vito A. DePalma; William Keith Goebel, both of Rochester; Scott Eric Tunney, Ontario, all of N.Y.

[73] Assignee: Eastman Kodak Company, Rochester, N.Y.

[21] Appl. No.: 681,582

[22] Filed: Jul. 29, 1996

[51] Int. Cl.⁶ .................... G03G 13/20; B32B 9/04
[52] U.S. Cl. .................. 430/124; 430/291; 430/945; 427/485
[58] Field of Search .................. 430/124, 291; 427/485

[56] References Cited

U.S. PATENT DOCUMENTS

| | | | |
|---|---|---|---|
| 3,820,987 | 6/1974 | Wells et al. | 430/33 |
| 4,692,394 | 9/1987 | Drexler | 430/140 |
| 4,908,225 | 3/1990 | Niimura et al. | 427/485 |
| 4,973,572 | 11/1990 | DeBoer | 430/201 |
| 5,043,251 | 8/1991 | Sonnenschein et al. | 430/297 |
| 5,045,888 | 9/1991 | Imaeda | 355/282 |
| 5,339,146 | 8/1994 | Aslam et al. | 355/285 |
| 5,354,582 | 10/1994 | Mahmud | 427/485 |
| 5,429,909 | 7/1995 | Kaszczuk et al. | 430/273 |
| 5,582,669 | 12/1996 | Gove et al. | 158/239 |

FOREIGN PATENT DOCUMENTS

50/023826   6/1984   Japan ........................ 430/109

*Primary Examiner*—Roland Martin
*Attorney, Agent, or Firm*—Harold E. Cole

[57] ABSTRACT

A process of forming a single color, ablation image having improved abrasion resistance comprising:

a) imagewise-heating by means of a laser an ablative recording element comprising a support having thereon an image layer comprising an image dye or pigment dispersed in a polymeric binder, which causes the image layer to ablate imagewise, the image layer having a near infrared-absorbing material associated therewith to absorb at a given wavelength of the laser used to expose the element, the image dye or pigment absorbing in the region of from about 300 to about 700 nm;

b) removing the ablated material to obtain an image in the ablative recording element;

c) either charging the imaged, ablative recording element to a given polarity or applying a voltage across the surface of the element which is attracted to a conductive surface behind the element;

d) applying colorless, charged particles to the element which causes them to be electrostatically attracted to the surface of the image layer; and e) heat-fusing the particles to obtain a protective overcoat over the entire surface of the image layer.

7 Claims, No Drawings

1

LASER DYE OR PIGMENT REMOVAL IMAGING PROCESS

This invention relates to a laser dye or pigment removal imaging process, and more particularly to a process for applying a colorless, abrasion-resistant overcoat on an element obtained by such a process.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to one of the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off the image dye at the spot where the laser beam hits the element and leaves the binder behind. In ablative imaging, the laser radiation causes rapid local changes in the imaging layer thereby causing the material to be ejected from the layer. This is distinguishable from other material transfer techniques in that some sort of chemical change (e.g., bond-breaking), rather than a completely physical change (e.g., melting, evaporation or sublimation), causes an almost complete transfer of the image dye rather than a partial transfer. Usefulness of such an ablative element is largely determined by the efficiency at which the imaging dye can be removed on laser exposure. The transmission Dmin value is a quantitative measure of dye clean-out: the lower its value at the recording spot, the more complete is the attained dye removal.

One way to improve abrasion resistance of an element is to use lamination. Lamination involves placing a durable and/or adhesive protective layer coated on a suitable support to the image which is to be protected. The support of the protective coating may remain permanently adhered or it may subsequently be peeled off leaving only the protective layer adhered to the image. Lamination has several disadvantages in that it brings about an added expense associated with coating an additional support. In addition, air pockets may be trapped during the laminating step leading to image defects.

Another commonly used method for protecting images from surface damage is to apply a liquid overcoat. This method may avoid the problem of air trapping, but has many other problems, such as handling of liquids which may be messy or difficult to dry and cure, and the use of environmentally undesirable solvents.

In U.S. Pat. No. 5,429,909, a polymeric protective overcoat is applied to the surface of a laser ablative imaging element prior to the laser-writing process. There is a problem with this method in that a relief pattern of image dye and overcoat protrudes from the surface of the support and is sensitive to scratch and abrasion.

Electrostatic deposition of charged toner particles to a photoconductor carrying an oppositely charged image pattern, subsequent transfer of the toner image to a suitable receiver and heat fusing the toner particles to generate a final image is a well-known process in the electrophotographic art. In addition, charged, clear toners have been applied to electrostatically-generated images as disclosed in U.S. Pat. Nos. 5,339,146 and 5,045,888; and in Japanese Kokai 50/023826. However, these references do not disclose the use of such toners as a protective layer applied by a post-imaging step in a laser dye removal imaging system.

It is an object of this invention to provide an ablative, single-sheet process for producing an ablation image which does not require a separate receiving element and which has improved scratch and abrasion resistance. It is another object of this invention to provide an overcoat layer on an ablative recording element which is applied after imaging, so that the overcoat layer covers the entire surface of the ablative element, thus eliminating the protruding relief image problem.

These and other objects are achieved in accordance with the invention which relates to a process of forming a single color, ablation image having improved abrasion resistance comprising:

a) imagewise-heating by means of a laser an ablative recording element comprising a support having thereon an image layer comprising an image dye or pigment dispersed in a polymeric binder, which causes the image layer to ablate imagewise, the image layer having a near infrared-absorbing material associated therewith to absorb at a given wavelength of the laser used to expose the element, the image dye or pigment absorbing in the region of from about 300 to about 700 nm;

b) removing the ablated material to obtain an image in the ablative recording element;

c) either charging the imaged, ablative recording element to a given polarity or applying a voltage across the surface of the element which is attracted to a conductive surface behind the element;

d) applying colorless, charged particles to the element which causes them to be electrostatically attracted to the surface of the image layer; and e) heat-fusing the particles to obtain a protective overcoat over the entire surface of the image layer.

The protective overcoat applied by the process of this invention improves the scratch-resistance and abrasion-resistance of the element. This is important, for example, in reprographic mask and printing mask applications where a scratch can remove fine line detail creating a defect in all subsequently exposed work. The dye or pigment removal process can be either continuous (photographic-like) or half-tone. For purposes of this invention, monocolor refers to any single dye or pigment or mixture used to produce a single stimulus color. The resulting single-sheet medium can be used for creating medical images, reprographic masks, printing masks, etc., or it can be used in any application where a monocolored transmission sheet is desired. The image obtained can be positive or negative.

In a preferred embodiment of the invention, the ablative recording element contains a barrier layer between the support and the image layer, such as those described and claimed in copending U.S. Pat. Nos. 5,459,017 and 5,468,591, the disclosures of which are hereby incorporated by reference.

As noted above, after imaging, the recording element is either charged to a given polarity or a voltage is applied across the surface of the element which is attracted to a conductive surface behind the element charging the surface of the element may be accomplished, for example, by using a high voltage corona which charges the entire surface of the recording element. For example, a high voltage power supply can be connected to a wire suspended over the surface of the element, the surface layer being grounded. When the high voltage is applied, ions will be deposited on the surface of the element, the polarity of which is determined by the polarity of the voltage applied. This is well known in the electrophotographic art, as shown, for example, by U.S. Pat. Nos. 4,478,870; 4,423,951 and 4,041,312, the disclosures of which are hereby incorporated by reference.

Another method of attracting toner particles to the surface of the recording element is to use a technique called biased development. This method involves applying a voltage across the surface of the element which is attracted to a conductive surface, such as a metal surface, behind the element. This method creates a mechanism whereby particles will become attracted to the surface of the recording element.

The toner particles may be charged, for example, by agitating the toner particles with a magnetic carrier, such as ferrite particles, in a mixing chamber. The charge level and polarity of the toner can be adjusted by the addition of charge control agents to the toner or polymer coatings on the magnetic carrier. This can take place in a matter of several seconds up to a minute. This is well known in the electrophotographic art, as shown, for example, by U.S. Pat. No. 4,546,060, the disclosure of which is hereby incorporated by reference.

After the toner particles are mixed and charged, they are transported, usually by rotating magnets contained in a shell, to an offset roller. The particles are then attracted and then transferred to the recording element by electrostatic forces using one of the techniques described above.

After the colorless, oppositely-charged particles are applied to the surface of the element, the particles are heat- and/or pressure-fused to obtain a protective overcoat over the entire image. This can be accomplished by passing the recording element through a pair of heated rollers, heated to a temperature of, for example, 100° C. to about 200° C., using a pressure of about $6.9 \times 10^3$ to about $8.3 \times 10^4$ Pa (10-120 psi) at a transport rate of about 0.005 m/s to about 0.50 m/s. This is well known in the electrophotographic art, as shown, for example, by U.S. Pat. No. 3,861,863, the disclosure of which is hereby incorporated by reference.

Colorless toner particles, well-known in the electrophotographic art, may be used in the process of this invention. There can be used, for example, those materials disclosed in U.S. Pat. Nos. 5,339,146; 5,045,888; and in Japanese Kokai 50/023826, the disclosures of which are hereby incorporated by reference. Examples of such materials include resins which are generally colorless, or almost colorless and transparent, and whose softening point is in the range of from about 50° to about 150° C.

Examples of such particles include poly(vinyl chloride), poly(vinylidene chloride), poly(vinyl chloride-co-vinylidene chloride), chlorinated polypropylene, poly(vinyl chloride-co-vinyl acetate), poly(vinyl chloride-co-vinyl acetate-co-maleic anhydride), ethyl cellulose, nitrocellulose, poly(acrylic acid) esters, linseed oil-modified alkyd resins, rosin-modified alkyd resins, phenol-modified alkyd resins, phenolic resins, polyesters, poly(vinyl butyral), polyisocyanate resins, polyurethanes, poly(vinyl acetate), polyamides, chroman resins, gum damar, ketone resins, maleic acid resins, vinyl polymers such as polystyrene and polyvinyltoluene or copolymers of vinyl polymers with methacrylates or acrylates, low-molecular weight polyethylene, phenol-modified pentaerythritol esters, poly(styrene-co-indene-co-acrylonitrile), poly(styrene-co-indene), poly(styrene-co-acrylonitrile), copolymers with siloxanes, polyalkenes and poly(styrene-co-butadiene), which may be used either alone or in combination. In a preferred embodiment of the invention, the colorless particles are made of either a polyester or poly(styrene-co-butyl acrylate).

To increase the abrasion resistance of the overcoat layer, polymers which are crosslinked or branched can be used. For example, there can be used, poly(styrene-co-indene-co-divinylbenzene), poly(styrene-co-acrylonitrile-co-divinylbenzene) or poly(styrene-co-butadiene-co-divinylbenzene).

The invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high UV Dmax. If it does not do this, the printing plate would not be developable to give regions which take up ink and regions which do not.

In a preferred embodiment of the invention, the image dye or pigment in the ablative recording element is substantially transparent in the near infrared region of the electromagnetic spectrum (700 to 1100 nm) and absorbs in the region of from about 300 to about 700 nm and does not have substantial absorption at the wavelength of the laser used to expose the element. Generally, the image dye or pigment is a different material from the infrared-absorbing material used in the element to absorb the infrared radiation and provides visible and/or UV contrast at wavelengths other than the laser recording wavelengths. However, a pigment such as carbon could be used and would act as both the image pigment and near infrared-absorber. Thus, one material would perform two functions.

Any polymeric material may be used as the binder in the recording element employed in the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly(vinyl acetate); polystyrene; poly(styrene-co-acrylonitrile); a polysulfone; a poly(phenylene oxide); a poly(ethylene oxide); a poly(vinyl alcohol-co-acetal) such as poly(vinyl acetal), polycyanoacrylate, poly(vinyl alcohol-co-butyral) or poly(vinyl benzal); or mixtures or copolymers thereof. The binder may be used at a coverage of from about 0.1 to about 5 g/m². In a preferred embodiment, the polymeric binder used in the recording element employed in the process of the invention is nitrocellulose.

To obtain a laser-induced, ablative image using the process of the invention, a diode laser is preferably employed since it offers substantial advantages in terms of its small size, low cost, stability, reliability, ruggedness, and ease of modulation. In practice, before any laser can be used to heat an ablative recording element, the element must contain a near infrared-absorbing material, such as pigments like carbon black, or cyanine infrared-absorbing dyes as described in U.S. Pat. No. 4,973,572, or other materials as described in the following U.S. Pat. Nos. 4,948,777; 4,950,640; 4,950,639; 4,948,776; 4,948,778; 4,942,141; 4,952,552; 5,036,040 and 4,912,083, the disclosures of which are hereby incorporated by reference. The laser radiation is then absorbed into the image layer containing a dye or pigment and convened to heat by a molecular process known as internal conversion. Thus, the construction of a useful image layer will depend not only on the hue, transferability and intensity of the dye or pigment, but also on the ability of the image layer to absorb the radiation and convert it to heat. The near infrared-absorbing material or dye may be contained in the image layer itself or in a separate layer associated therewith, i.e., above or below the image layer. In a preferred embodiment of the invention, the laser exposure takes place on or through the image layer side of the ablative recording element, which enables this process to be a single-sheet process, i.e., no separate receiving element is required.

Lasers which can be used in the invention are available commercially. There can be employed, for example, Laser Model SDL-2420-H2 from Spectra Diode Labs, or Laser Model SLD 304 V/W from Sony Corp.

Any image dye can be used in the ablative recording element employed in the invention provided it can be ablated by the action of the laser and has the characteristics described above. Especially good results have been obtained with dyes such as anthraquinone dyes, e.g., Sumikaron Violet RS® (product of Sumitomo Chemical Co., Ltd.), Dianix Fast Violet 3R-FS® (product of Mitsubishi Chemical Industries, Ltd.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumikaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Industries, Ltd.) and Direct Brown M® and Direct Fast Black D® (products of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite Green® (product of Hodogaya Chemical Co., Ltd.);

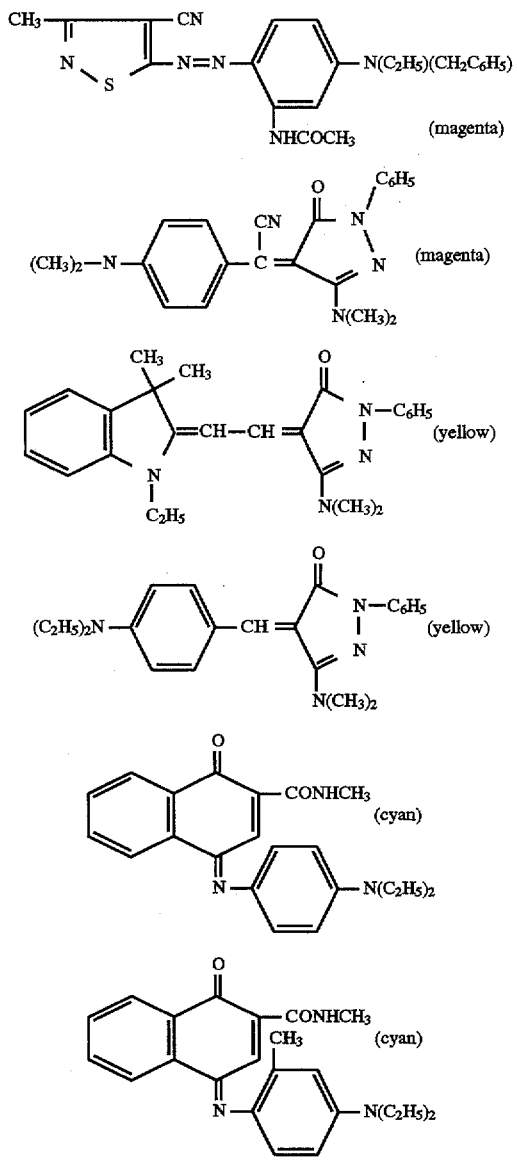

or any of the dyes disclosed in U.S. Pat. Nos. 4,541,830; 4,698,651; 4,695,287; 4,701,439; 4,757,046; 4,743,582; 4,769,360 and 4,753,922, the disclosures of which are hereby incorporated by reference. The above dyes may be employed singly or in combination. The dyes may be used at a coverage of from about 0.05 to about 1 g/m² and are preferably hydrophobic.

Pigments which can be used in the image layer include inorganic pigments such as carbon black or graphite. Examples of organic pigments which can be used in the invention include metal phthalocyanines such as copper phthalocyanine, quinacridones, epindolidiones, Rubine F6B (C.I. No. Pigment 184); Cromophthal.RTM. Yellow 3G (C.I. No. Pigment Yellow 93); Hostaperm.RTM. Yellow 3G (C.I. No. Pigment Yellow 154); Monastral.RTM. Violet R (C.I. No. Pigment Violet 19); 2,9-dimethylquinacridone (C.I. No. Pigment Red 122); Indofast.RTM. Brilliant Scarlet R6300 (C.I. No. Pigment Red 123); Quindo Magenta RV 6803; Monstral.RTM. Blue G (C.I. No. Pigment Blue 15); Monstral.RTM. Blue BT 383D (C.I. No. Pigment Blue 15); Monstral.RTM. Blue G BT 284D (C.I. No. Pigment Blue 15); Monstral.RTM. Green GT 751D (C.I. No. Pigment Green 7) or any of the materials disclosed in U.S. Pat. Nos. 5,171,650 or 5,516,622, the disclosures of which are hereby incorporated by reference. Combinations of pigments and/or dyes can also be used. The pigments may be employed at a coverage of from about 0.05 to about 5 g/m².

The image layer of the ablative recording element employed in the invention may be coated on the support or printed thereon by a printing technique such as a gravure process.

Any material can be used as the support for the ablative recording element employed in the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly (tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 500 μm. In a preferred embodiment, the support is transparent.

The following examples are provided to illustrate the invention.

EXAMPLE 1

Dye Removal

The structural formulas of the dyes referred to below are:

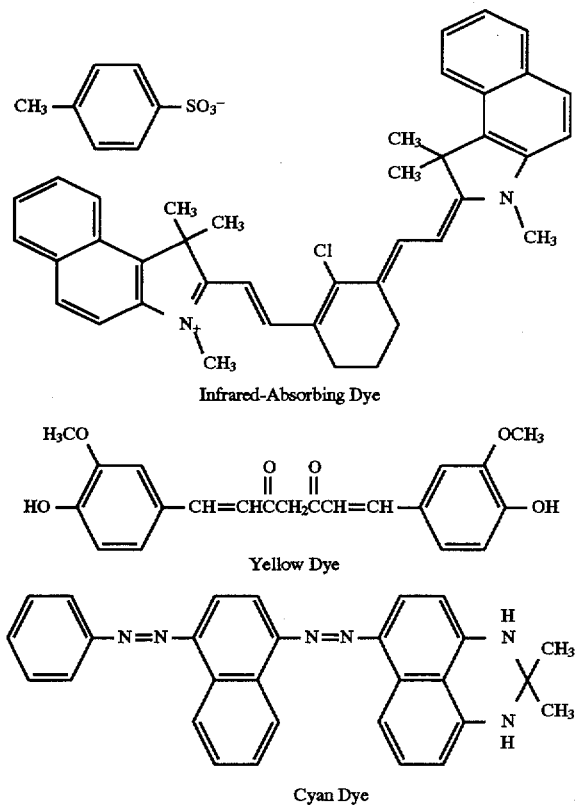

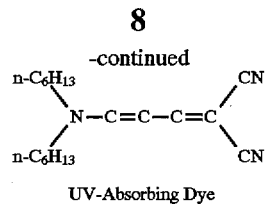

UV-Absorbing Dye

A 103 μm poly(ethylene terephthalate) support was coated with a layer of 0.38 g/m² polycyanoacrylate binder, 0.05 g/m² IR-absorbing dye, and 0.005 g/m² Fluorad FC-431® surfactant (3M Corp.). A second layer was applied over this coating consisting of 0.43 g/m² nitrocellulose, 0.17 g/m² IR-absorbing dye, 0.34 g/m² UV-absorbing dye, 0.14 g/m² Yellow dye, and 0.24 g/m² Cyan dye.

Printing

The element was ablation written using a laser diode print head, where each laser beam has a wavelength range of 830–840nm and a nominal power output of 600 mW at the film plane. The lasers were individually turned on and off to yield an image.

The drum, 53 cm in circumference, was rotated at varying speeds and the imaging electronics were activated to provide adequate exposure. The translation stage was incrementally advanced across the ablation element by means of a lead screw turned by a microstepping motor, to give a center-to-center line distance of 10.58 μm (94,500 lines per meter or 2400 lines per inch). An air stream was blown over the ablation element surface to remove the ablated dye. The ablated dye and other effluents were collected by suction. The measured total power at the focal plane was 600 mW per channel maximum.

Electrostatic toning was accomplished by placing 800 g of polymer and magnetic carrier particles in a toner holder. The carrier consisted of particles of an iron strontium (6:1) ceramic material with a nominal size of 30–50 μm. The carrier transported the toner by means of rotating magnets in a shell to an offset roller. The imaged element was fed through the rollers with the coated side toward the offset roller at a speed of 8 cm/s. A bias of 1250V was applied to a backing roller to transfer approximately 5.38 g of particles per m² of element. No carrier was detectable on the film.

Fusing was accomplished by running the toned element through heated rollers at 121° C. Two different clear toner materials were compared and contrasted for their abrasion resistance and suitability as an image overcoat. The first was a polyester toner, Kao M® (KAO Inc., Racine Wis.) ground to an average size of 10 μm. The second polymer was Picotoner 1221® (Goodyear Inc.) which is a poly(styrene-co-butyl acrylate) copolymer which was again ground to an average size of 10 μm.

Results obtained with the dye removal imaging system are shown in Table 1 below in a D-max area, since this is the area which is most sensitive to scratches and abrasions. (Dye cannot be removed in a Dmin area, since there is no dye in that area). Abrasion sensitivity was measured using a 50 cycle Taber abrasion test. The Taber test gently scratches the surface in a controlled manner using a pair of weighted disks. The degree of abrasion was quantified by examining the change in UV density.

Density measurements were made with an X-Rite Model 361T densitometer. Results are reported as percent loss of UV density in the abraded region versus unabraded material. The following results were obtained:

TABLE 1

| ELEMENT | UV DENSITY BEFORE ABRASION TEST | UV DENSITY AFTER ABRASION TEST | % UV DENSITY LOSS |
| --- | --- | --- | --- |
| no overcoat (control) | 3.6 | 1.5 | 58 |
| polyester toner overcoat | 3.5 | 3.4 | 3 |
| no overcoat (control) | 3.4 | 1.3 | 62 |
| poly(styrene-co-butyl acrylate) toner overcoat | 3.6 | 3.0 | 17 |

The above results show that the applied toner overcoat gave substantially better abrasion resistance of the resulting image than that obtained with the control which had no overcoat.

Optical micrographs were also obtained and show no image smear after fusing for the elements prepared according to the invention.

EXAMPLE 2

Pigment Removal

A 103 μm poly(ethylene terephthalate) support was coated with a layer of 0.38 g/m² polycyanoacrylate binder, 0.05 g/m² of IR-absorbing dye, and 0.005 g/m² Fluorad FC-431® suffactant (3M Corp.). A second layer was applied over this coating consisting of 0.32 g/m² nitrocellulose, 0.065 g/m² IR-absorbing dye and 0.65 g/m² of carbon black (Cabot Black Pearl® 450).

Printing

The element was printed as in Example 1 except that a bias of 2250V was applied to a backing roller to transfer approximately 11.43 g of polyester particles per m² of element. The following results were obtained:

TABLE 2

| ELEMENT | UV DENSITY BEFORE ABRASION TEST | UV DENSITY AFTER ABRASION TEST | % UV DENSITY LOSS |
| --- | --- | --- | --- |
| no overcoat (control) | 4.8 | 1.7 | 65 |
| polyester toner overcoat | 4.2 | 4.0 | 5 |

The above results show that the applied toner overcoat gave substantially better abrasion resistance of the resulting image than that obtained with the control which had no overcoat.

Optical micrographs were also obtained and again show no image smear after fusing for the elements prepared according to the invention.

The invention has been described in detail with particular reference to preferred embodiments thereof, but it will be understood that variations and modifications can be effected within the spirit and scope of the invention.

What is claimed is:

1. A process of forming a single color, ablation image having improved abrasion resistance comprising:

a) imagewise-heating by means of a laser an ablative recording element comprising a support having thereon an image layer comprising an image dye or pigment dispersed in a polymeric binder, which causes said image layer to ablate imagewise, said image layer having a near infrared-absorbing material associated therewith to absorb at a given wavelength of the laser used to expose said element, said image dye or pigment absorbing in the region of from about 300 to about 700 nm;

b) removing said ablated material to obtain an image in said ablative recording element;

c) either charging said imaged, ablative recording element to a given polarity or applying a voltage across the surface of said element which is attracted to a conductive surface behind said element;

d) applying colorless, charged particles to said element which causes them to be electrostatically attracted to the surface of said image layer; and e) heat-fusing said particles to obtain a protective overcoat over the entire surface of said image layer.

2. The process of claim 1 wherein said infrared-absorbing material is a dye which is contained in said image layer.

3. The process of claim 1 wherein said support is transparent.

4. The process of claim 1 wherein a barrier layer is present between said support and said image layer.

5. The process of claim 1 wherein said polymeric binder comprises nitrocellulose.

6. The process of claim 1 wherein said colorless particles comprise either a polyester or poly(styrene-co-butyl acrylate).

7. The process of claim 1 wherein step c) was performed by applying a voltage across the surface of said element which is attracted to a metal surface behind said element.

* * * * *